(12) United States Patent
Kawashiro

(10) Patent No.: US 8,232,652 B2
(45) Date of Patent: Jul. 31, 2012

(54) SEMICONDUCTOR DEVICE

(75) Inventor: Fumiyoshi Kawashiro, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/053,969

(22) Filed: Mar. 22, 2011

(65) Prior Publication Data

US 2011/0233768 A1    Sep. 29, 2011

(30) Foreign Application Priority Data

Mar. 24, 2010   (JP) ................................. 2010-068892

(51) Int. Cl.
*H01L 23/48*   (2006.01)
*H01L 23/52*   (2006.01)
*H01L 29/40*   (2006.01)

(52) U.S. Cl. ........................ 257/772; 257/779
(58) Field of Classification Search .................. 257/772, 257/779, 780, 781, 766, 762
See application file for complete search history.

(56) References Cited

U.S. PATENT DOCUMENTS

| | | | | |
|---|---|---|---|---|
| 5,953,623 | A * | 9/1999 | Boyko et al. | 438/612 |
| 2003/0193094 | A1* | 10/2003 | Takahashi et al. | 257/780 |
| 2010/0159692 | A1* | 6/2010 | Swaminathan | 438/613 |
| 2011/0193223 | A1* | 8/2011 | Ozaki et al. | 257/737 |
| 2011/0220398 | A1* | 9/2011 | Sakuyama et al. | 174/257 |
| 2011/0266030 | A1* | 11/2011 | Swaminathan et al. | 174/126.2 |

FOREIGN PATENT DOCUMENTS

JP   2001-114747 A   4/2001
JP   2004-154845 A   6/2004

* cited by examiner

*Primary Examiner* — S. V Clark
(74) *Attorney, Agent, or Firm* — Foley & Lardner LLP

(57) ABSTRACT

A semiconductor device includes: an interconnection substrate on which a semiconductor chip is mounted; electrodes formed on a surface of the interconnection substrate; and solder bumps formed on the electrodes. The solder bump includes a base section and a surface layer section that covers the base section. The surface layer section includes conductive metal selected from the group consisting of Cu, Ni, Au, and Ag, and Sn at least and a ratio of the number of atoms of the conductive metal to the number of Sn atoms per a unit volume is more than 0.01.

10 Claims, 9 Drawing Sheets

Fig. 8

| | SOLUBILITY (in water) | SOLUBILITY (water in) | SOLUBILITY PARAMETER | CAS |
|---|---|---|---|---|
| Hexyl Diglycol | 1.7 | 56.3 | 9.7 | 112-59-4 |
| 2-Ethyl Hexyl Glycol | 0.2 | 5.2 | 9.0 | 1559-35-9 |
| 2-Ethyl Hexyl Diglycol | 0.3 | 12.5 | 9.2 | 1559-36-0 |
| Phenyl Glycol | 2.7 | 10.8 | 11.5 | 122-99-6 |
| Phenyl Diglycol | 3.4 | 24.4 | | 104-68-7 |
| Benzyl Glycol | 0.4 | 18 | 10.8 | 622-08-2 |
| Butyl Propylene Diglycol | 3 | 12 | 8.2 | 29911-28-2 |
| Phenyl Propylene glycol | 0.2 | 6.9 | 10.5 | 770-35-4 |
| Dibutyl Diglycol | 0.3 | 1.4 | 8.3 | 29911-28-2 |
| Propyl Propylene Diglycol | 4.8 | 18.7 | 8.6 | 29911-27-1 |
| Butyl Propylene Glycol | 6.4 | 15.5 | 8.9 | 5131-66-8 |
| Isobutyl Diglycol | ∞ | ∞ | 8.7 | 18912-80-6 |
| Benzyl Diglycol | ∞ | | 9.6 | 2050-25-1 |
| B Terupineol | | | | 800-41-7 |
| Tripropylene Glycol | ∞ | ∞ | | 24800-440 |

SEMICONDUCTOR DEVICE

CROSS REFERENCE

This patent application claims a priority on convention based on Japanese Patent Application No. 2010-68892 filed on Mar. 24, 2010. The disclosure thereof is incorporated herein by reference.

FIELD OF THE INVENTION

The present invention relates to a semiconductor device and, in particular, to a semiconductor device including solder bumps.

A BGA (Ball Grid Array) structure is frequently used in which solder balls are connected to electrodes on an interconnection substrate on which a semiconductor chip and electronic components are mounted. In such a BGA structure, the solder balls and the electrodes on the interconnection substrate are heated so that the solder balls are melted and connected to the electrodes through a reflow step, in order to form the solder bumps.

A technique for improving machinery and electrical reliability of the solder bumps is disclosed in Patent Literature 1 (JP 2004-154845A) and Patent Literature 2 (JP 2001-114747A).

Patent Literature 1 discloses a lead-free solder for connection of an electronic device, which can suppress growth of an inter-metallic compound formed in a boundary from a package and a terminal surface of a printed circuit board metalized with Cu and a solder material, and which can solve a problem of a defect due to boundary fracture related to an impact resistance characteristic. The solder for connection of the electronic device includes mainly tin (Sn) and contains silver (Ag) of 5.0 weight % or below, copper (Cu) of 1.0 weight % or below, and elements segregating in grain boundaries of 0.008-0.10 weight %.

Also, Patent Literature 2 discloses a soldering flux used in formation of solder bumps. The soldering flux is water-soluble solder flux which contains a compound as an activator obtained by reacting dicyandiamide with glycidol in order to prevent the solder flux from influencing to insulation reliability when the solder flux remains in electric/electronic equipment.

Citation List:
 [Patent Literature 1]: JP 2004-154845A
 [Patent Literature 2]: JP 2001-114747A

SUMMARY

As a result of studying by the present inventor, it was found that a contact failure was caused between a solder bump and a contact pin of a test unit in an electrical test of a semiconductor device due to a residue of soldering flux remaining on the solder bump so that the electric test of the semiconductor device cannot be performed accurately. The following description is based on the result of the study by the present inventor.

With reference to FIG. 1, a part of a semiconductor device 110 in the vicinity of a solder bump is shown. FIG. 1 is an enlarged view of a portion of a region A in FIG. 12. In FIG. 12, a semiconductor chip 150 is mounted on an interconnection substrate 1 and an electric circuit (not shown) of the semiconductor chip 150 is connected to an interconnection (not shown) of the interconnection substrate 1 via a bonding wire 160. The interconnection of the interconnection substrate 1 is connected to an electrode 2 in FIG. 1. As shown in FIG. 1, the electrode 2 is formed in an opening portion of a solder resist layer 3 that is formed on the interconnection substrate 1. A solder bump 107 in FIG. 1 is formed by heating a solder ball (not shown) to be connected to the electrode 2 in a reflow step. In this step, the soldering flux is used in order to reserve the connection between the electrode 2 and the solder ball. By using the soldering flux, the electrode 2 and the solder ball are securely connected in the reflow step. The soldering flux is cleaned and removed after the electrode 2 and the solder ball are connected and the solder bump 107 is formed.

After forming the solder bump 107, the electric test is performed in order to confirm whether or not the semiconductor device 110 operates normally. The electric test is carried out by contacting a contact pin 11 of a testing unit to the solder bump 107.

Herein, there was a case where the semiconductor device 110 was not electrically operated when the electric inspection was carried out while contacting the contact pin 11 to the solder bump 107 even though there was no problem in electrical connection from the solder bump 107 to the semiconductor chip 150. When a surface analysis of the solder bump 107 at this time was performed, a thin layer 123 (referred to as "high resistance layer 123" hereinafter) was formed due to an insulating polysilicon compound and flux residue etc., and it was found that this formation of the thin layer 123 deteriorated the electric contact between the solder bump 107 and the contact pin 11. FIG. 2 schematically shows a neighborhood of a surface of the solder bump 107, based on the study by the present inventor.

It was found that the surface of the solder bump 107 has a structure including an oxide layer 22 having the thickness of 4 nm and a high resistance layer 123 having the thickness of 2 nm which are laminated in order on a base section 21 having a main component of tin (Sn). The oxide layer 22 includes a first oxide layer 24 and a second oxide layer 25. The first oxide layer 24 is a layer including a concentrated compound of tin (Sn), phosphorus (P) and oxygen (O) and is formed of the compound mixed with an alloy composing the base section 21. Phosphate of tin (Sn) is shown as an example of the compound. The second oxide layer 25 is a layer including a concentrated metal oxide and is formed of tin oxide ($SnO_x$) mixed with tin (Sn). The high resistance layer 123 includes an insulating soldering flux remaining without being removed after forming the solder bumps 107 and cleaning of the solder bumps 107, and an insulative polysilicon compound. The polysilicon compound is poly dimethyl siloxane (PDMS) which is contained in the solder resist layer 3, and a minute amount thereof is melted into the soldering flux and remains on the surface of the solder bump 107 together with the soldering flux.

The high resistance layer 123 degrades the electrical contact between the solder bump 107 and the contact pin 11 and peels off during the electric test and is adhered to and deposited on a contacting portion between the contact pin 11 and the solder bump 107. If such a contact pin 11 is continuously used for the test, the electrical contact between the contact pin 11 and the solder bump 107 is prevented and therefore the electric test of the semiconductor device 110 cannot be performed accurately.

In an aspect of the present invention, a semiconductor device includes: an interconnection substrate on which a semiconductor chip is mounted; electrodes formed on a surface of the interconnection substrate; and solder bumps formed on the electrodes.

The solder bump includes a base section and a surface layer section that covers the base section. The surface layer section includes conductive metal selected from the group consisting of Cu, Ni, Au, and Ag, and Sn at least and a ratio of the number of atoms of the conductive metal to the number of Sn atoms per a unit volume is more than 0.01.

According to the aspect of the present invention, there can be provided a semiconductor device capable of performing an electric test accurately by contacting a pin to a solder bump.

BRIEF DESCRIPTION OF THE DRAWINGS

The above and other objects, advantages and features of the present invention will be more apparent from the following description of certain embodiments taken in conjunction with the accompanying drawings, in which:

FIG. 8 is a table showing properties of substances applied to solvents;

DETAILED DESCRIPTION

Figure 6:
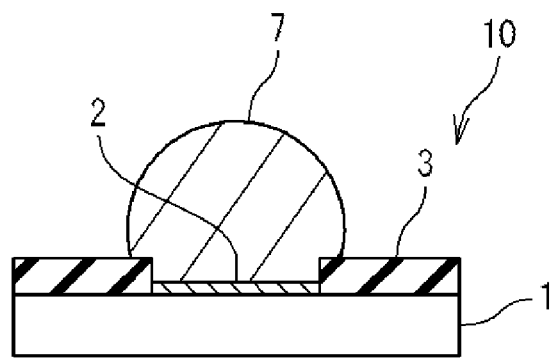
FIG. 6 is a sectional view showing the solder bump after cleaning.

Hereinafter, a semiconductor device according to the present invention will be described below with reference to the attached drawings. FIG. 6 is an enlarged view of a semiconductor device 10 of the present invention in the vicinity of a solder bump 7, and shows a region A of FIG. 12.

Figure 12:
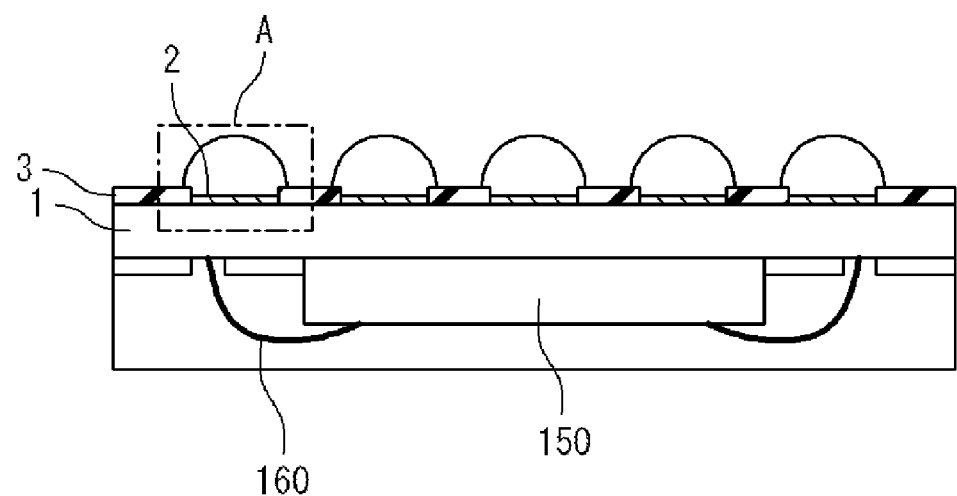
FIG. 12 is a sectional view of the semiconductor device.

The semiconductor device 10 of the present invention is provided with a plurality of electrodes 2 on an interconnection substrate 1 and a solder bump 7 is formed on each of the electrodes 2. Also, a semiconductor chip 150 is mounted on the interconnection substrate 1 as shown in FIG. 12. Each solder bump 7 that is formed on a surface of the interconnection substrate 1 on a side opposite to the semiconductor chip 150 is an external connection terminal functioning as a signal input/output terminal between the semiconductor device 10 and an external device and also functioning as a power supply terminal of the semiconductor device 10. Each solder bump 7 is electrically connected to an interconnection (not shown) in the interconnection substrate 1 via the electrode 2. The interconnection in the interconnection substrate 1 is electrically connected to an electric circuit (not shown) of the semiconductor chip 150 via a bonding wire 160 or a flip chip bonding (not shown).

Figure 9:
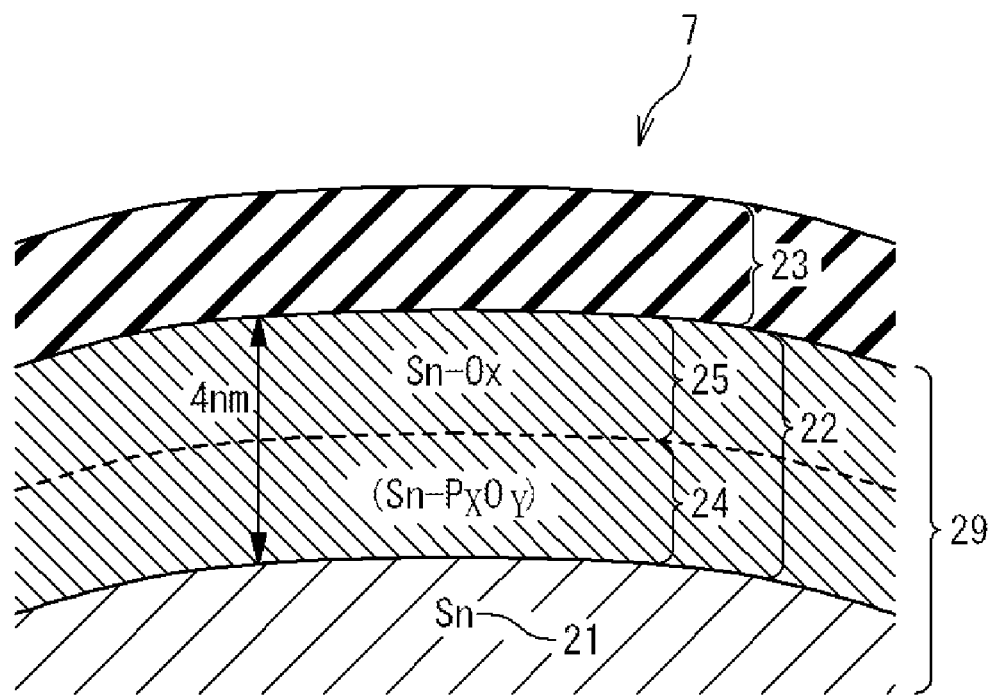
FIG. 9 is an enlarged sectional view showing the surface of the solder bump in the semiconductor device.

FIG. 9 is an enlarged view showing the surface of the solder bump 7 in the semiconductor device 10 of the present invention. The solder bump 7 includes a base material portion 29 having a main component of Sn and a surface layer portion 23 covering the base material portion 29. The thickness of the surface layer portion 23 is approximately in a range of 2 nm to 6 nm. The base material portion 29 includes a base material 21 and an oxide layer 22 covering the surface of the base material 21.

The surface layer portion 23 contains Sn and conductive metal and is formed in such a manner that a ratio of the number of atoms of the conductive metal to the number of Sn atoms per a unit volume is larger than 0.01. Herein, the conductive metal includes any of Cu, Ni, Au, and Ag and a combination thereof. It is further preferable that the ratio of the number of atoms of the conductive metal to the number of Sn atoms per a unit volume is equal to 0.015 or larger. This ratio may be quantitatively evaluated by TOF-SIMS (Time-of-Flight Secondary Ion Mass Spectroscopy).

The surface layer portion 23 may further contain Si or C. However, since Si forms a polysilicon compound, e.g., an insulating substance such as poly-dimethyl siloxane (PDMS) and C forms an organic insulating material, the ratio of the number of Si or C atoms to the number of Sn atoms per a unit volume is made smaller than 0.01.

The oxide layer 22 has the thickness of about 4 nm and includes a first oxide layer 24 and a second oxide layer 25 in this order from the side of the base material 21. The first oxide layer 24 includes mainly tin phosphate $SnP_xO_y$. The second oxide layer 25 covering the first oxide layer 24 includes mainly tin oxide $SnO_x$.

Next, a manufacturing method of the present invention will be described with reference to FIGS. 3 to 7. FIGS. 3 to 7, similar to FIG. 6, are also enlarged views of the semiconductor device 10 of the present invention in the vicinity of the solder bump 7. As shown in FIG. 12, a plurality of solder bumps 7 are formed in the semiconductor device 10 of the present invention. Initially, the interconnection substrate 1 provided with the semiconductor chip 150 mounted thereon is prepared. A plurality of electrodes 2 are formed on the surface of the interconnection substrate 1, and a solder resist layer 3 is formed on the surface of the interconnection substrate 1 including the electrodes 2 and the solder resist layer 3 is partially opened so as to expose each of the electrodes 2. The solder resist layer 3 is formed of a material that is hard to be wet with the solder and contains an organic substance exemplified as organic silicon (e.g., siloxane), acryl, and epoxy. The electrode 2 is formed of a conductive metal such as Cu. An electric circuit (not shown) of the semiconductor chip 150 is connected to an interconnection (not shown) on the interconnection substrate 1 via a bonding wire 160, and the interconnection on the interconnection substrate 1 is connected to each of the electrodes 2. Thus, each of the electrodes 2 is electrically connected to the electric circuit (not shown) of the semiconductor chip 150 mounted on the interconnection substrate 1.

Figure 1:
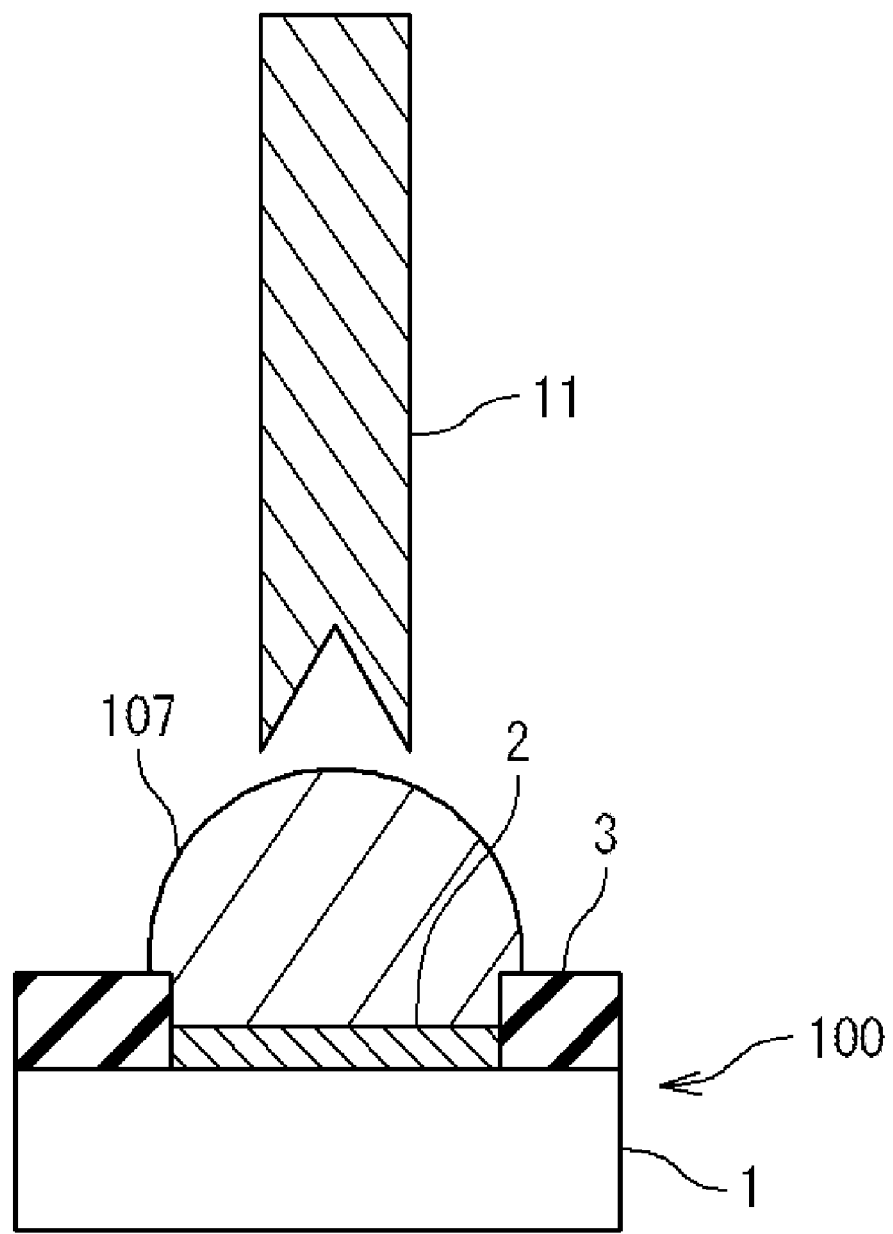
FIG. 1 is a sectional view showing a semiconductor device in a vicinity of a solder bump in an electric test.
Figure 2:
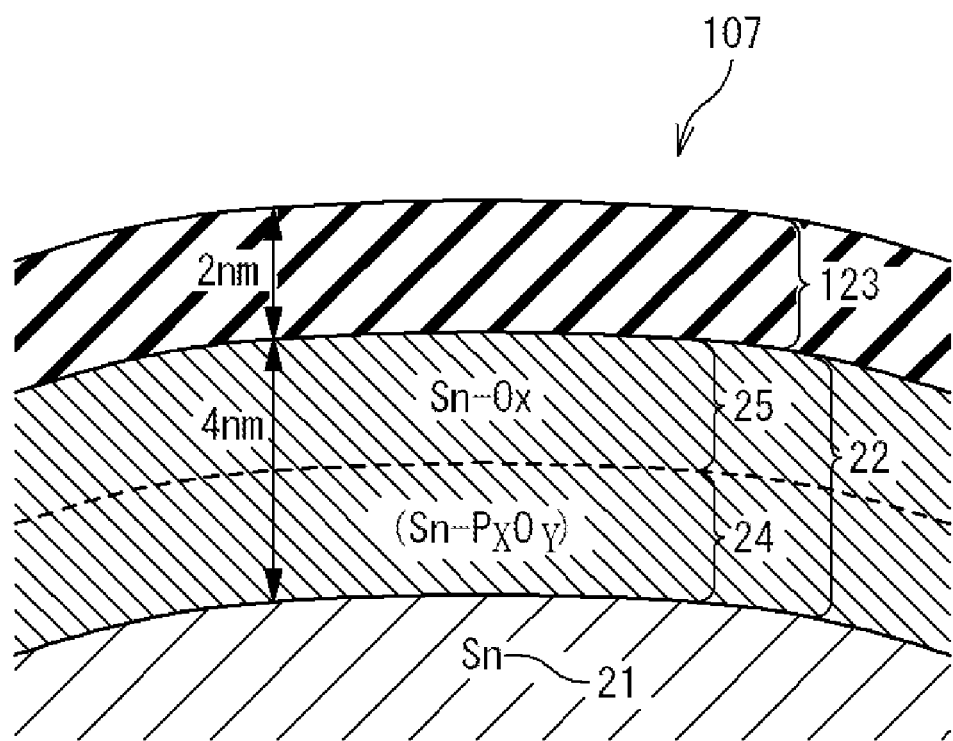
FIG. 2 is a sectional view schematically showing the surface of the solder bump.
Figure 3:
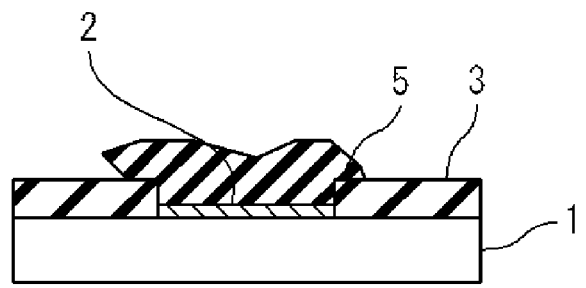
FIG. 3 is a sectional view showing an electrode of an interconnection substrate coated with soldering flux.

Next, as shown in FIG. 3, soldering flux 5 is applied on each of the electrodes 2. The application of the soldering flux 5 may be performed by a squeegee printing method, a closed-type pressure printing method and the other methods. It should be noted that the soldering flux 5 used here has a special composition as to be described later.

Figure 4:
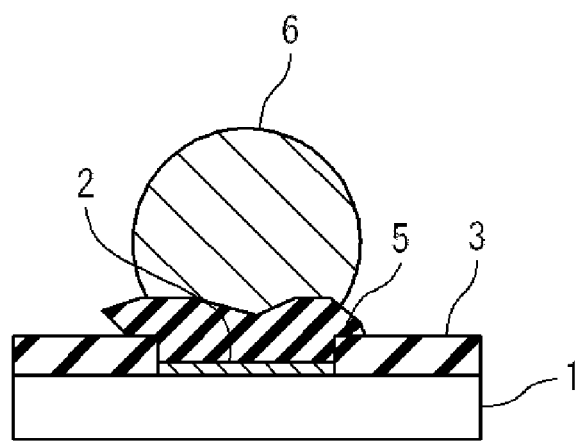
FIG. 4 is a sectional view showing a solder ball mounted on the solder flux.

After the soldering flux 5 is applied, a plurality of solder balls 6 are mounted on the interconnection substrate 1 as shown in FIG. 4. Each of the solder balls 6 is arranged on the interconnection substrate 1 so as to be in contact with the soldering flux 5.

Figure 5:
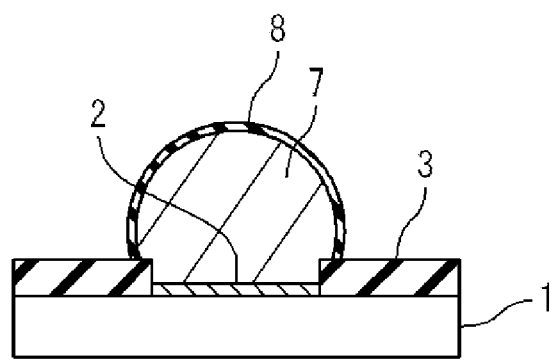
FIG. 5 is a sectional view showing a solder bump after the solder ball is heated.

After the plurality of solder balls 6 are mounted on the interconnection substrate 1, the interconnection substrate 1 is heated in a reflow step. Through this heating, the soldering flux 5 covers a surface of each of the solder balls 6 and a surface of each of the electrodes 2, and each of the solder balls 6 is melted to form each of the solder bumps 7 at the same time. After the formation of the solder bump 7 is completed, a flux layer 8 is formed with the soldering flux 5 on the surface of the solder bump 7 as shown in FIG. 5.

The flux layer 8 contains the material of the solder resist layer 3, and substances due to contaminants covering the electrode 2 and the solder ball 6 in addition to the material of the soldering flux 5. As the material of the flux layer 8, silicon oxide compound R—$SO_x$, poly-dimethyl siloxane (PDMS), acryl, and epoxy are exemplified.

Then, the semiconductor device 10 is water-washed to remove the flux layer 8, as shown in FIG. 6. Since the soldering flux 5 used in the present invention contains a solvent having the solubility in water of 0.01 weight % or more and amine having the solubility in water of 5 weight % or more, the flux layer 8 can be removed through water-washing. Moreover, since the amine contained in the soldering flux 5 used in the present invention is coordinate-bonded with Cu, Ni, Au, or Ag, the ligand of the amine is removed by the water at the time of water-washing so that Cu, Ni, Au, or Ag is deposited on the surface of the solder bump 7. The surface layer portion 23 shown in FIG. 9 is formed of the deposited Cu, Ni, Au, or Ag. Part of Cu, Ni, Au, or Ag may have the coordinate-bonding with the amine.

Figure 7:
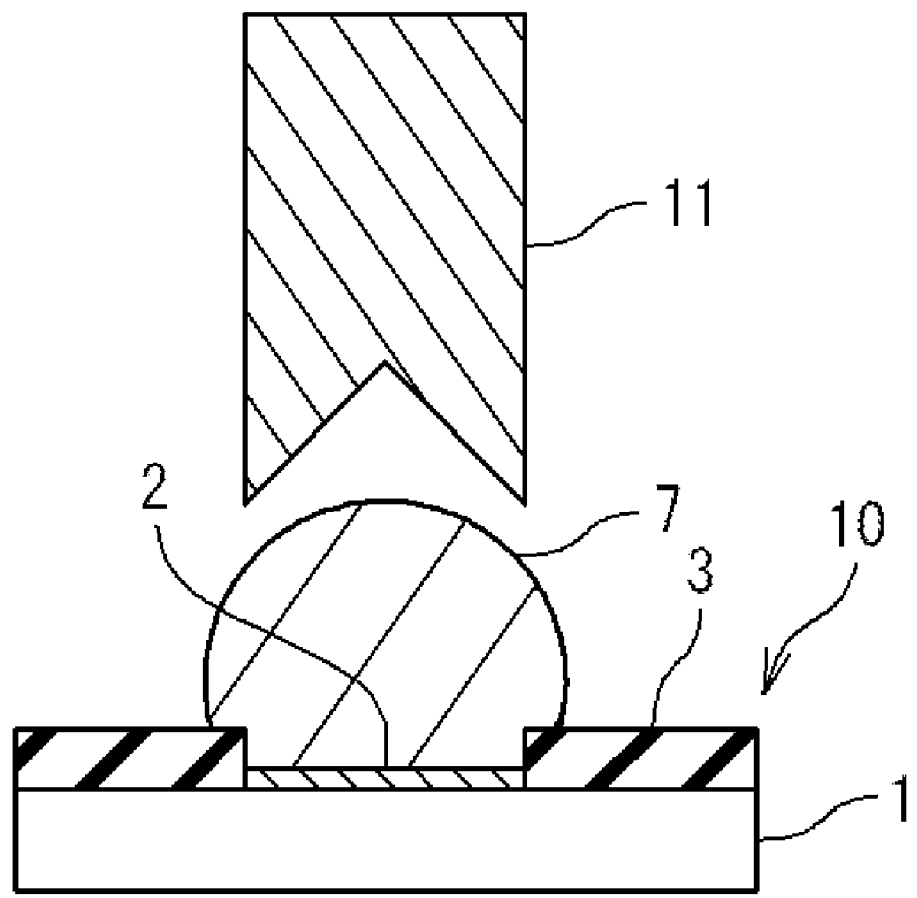
FIG. 7 is a sectional view showing a contact pin used in the test of a semiconductor device.

After the water-washing, the electric test of the semiconductor device 10 is carried out using a testing unit. As shown in FIG. 7, the testing unit includes a contact pin 11 formed of conductor, and the conduct pin 11 is brought into direct contact with the solder bump 7 to thereby carry out the electric test such as a conducting test. The testing unit includes a plurality of contact pins 11 corresponding to the solder bumps 7 although not shown in FIG. 7.

Next, the soldering flux 5 used in the manufacturing method of the present invention will be described below. The soldering flux 5 includes a solvent, organic acid and amine, and further may include a thickener and a surface-activating agent, if necessary.

The solvent of the soldering flux 5 has a boiling point equal to or higher than a melting point of solder at which the solder ball 6 is melted, and is formed of a material having the solubility in water in a range from 0.01 weight % to 6.8 weight %.

The reason why the solubility in water is 6.8 weight % or below is to increase affinity between the solvent and organic material so as to be able to dissolve and remove the organic material adhered to surfaces of the electrode 2, the solder balls 6 and the solder bumps 7. Meanwhile, the reason why the solubility in water is 0.01 weight % or more is to indicate that the solvent is dissolved at least in water. Thus, it becomes possible to remove the soldering flux 5 by the water-washing.

As such solvent, hexyl glycol, 2-ethyl hexyl glycol, 2-ethyl hexyl diglycol, phenyl glycol, phenyl diglycol, benzyl glycol, butyl propylene diglycol, phenyl propylene glycol, dibutyl diglycol, propyl-propylene diglycol and butyl propylene glycol are exemplified as shown in FIG. 8.

As organic substance adhered to the surfaces of the electrode 2, the solder ball 6 and the solder bump 7, organic compounds such as organic silicon, acrylic, and epoxy contained in the solder resist 3 are exemplified. In order to remove these organic compounds, it is desirable that the solubility in water is 5.0 weight % or lower. Therefore, it is desirable to use solvent having the solubility in water in a range of 0.01 weight % to 5.0 weight %. As such solvent, hexyl glycol, 2-ethyl hexyl glycol, 2-ethyl hexyl diglycol, phenyl glycol, phenyl diglycol, benzyl glycol, butyl propylene diglycol, phenyl propylene glycol, dibutyl diglycol and propyl-propylene diglycol are exemplified. It is assumed that the content of the solvent of the soldering flux 5 is in a range of 39 weight % to 69 weight %.

The amine contained in the soldering flux 5 includes a multidentate ligand having a plurality of radicals coordinating with one metal atom. Herein, the metal atom denotes Cu, Ni, Au or Ag. For example, as the amine mentioned above, ethylene-diamine, polyoxy ethylene-diamine or substance in which Cu, Au or Ag is coordinate-bonded to the derivative of them are exemplified. Moreover, cyclic hydrocarbon or water-soluble polyamine resin may be added to these amines.

It is sufficient that the metal such as Cu, Ni, Au or Ag is coordinate-bonded so as to be dissolved once in the amine of the soldering flux 5 and it is not necessary that the metal is initially coordinate-bonded to the amine of the soldering flux 5. That is, the conductive metal contained in the solder ball 6 or the electrode 2 may be coordinate-bonded to the amine when the soldering flux 5 is contacted to the solder ball 6 and the electrode 2.

Further, in order to secure water solubility of the soldering flux 5, the solubility in water of the amine is preferably 5 weight % or more. Moreover, since the soldering flux 5 is used at the time of melting the solder, it is preferable to have a boiling point equal to or higher than the melting point of the solder. Specifically, the amine having the boiling point of 250 ° C. or higher is used.

Ethoduomeen, jeffamine and ploxamine are exemplified as the amine satisfying these conditions. CAS No. of the ethoduomeen is 61790-85-0, CAS No. of the jeffamine is 65605-36-9 and CAS No. of the ploxamine is 11111-34-5. The content of the amine is assumed to be in a range of 30 weight % to 60 weight %.

The organic acid of the soldering flux 5 includes molecules that have a plurality of organic acid radicals per a single molecule, in order to increase activity per a mol. A carboxyl group is exemplified as the organic acid radicals. In order to activate the organic acid in a preliminary heating region in the reflow process, the melting point of the organic acid is preferably 145 ° C. or higher. In order to further raise the melting point, hydrogen atoms existing in positions other than positions of the carboxyl groups may be replaced with another functional group. It is assumed that the content of the organic acid of the soldering flux 5 is in a range of 1 weight % to 20 weight %.

Diglycolic acid $O(CH_2COOH)_2$, adipic acid HCOOH $(CH_2)_4COOH$, dimethylol-propionic acid $C_5H_{10}O_4$, succinic acid $C_4H_6O_4$ and citric acid $C_6H_8O_7$ are exemplified as the organic acid. CAS No. of diglycolic acid $O(CH_2COOH)_2$ is 110-99-6, CAS No. of adipic acid $HCOOH(CH_2)_4COOH$ is 124-04-9, CAS No. of dimethylol-propionic acid $C_5H_{10}O_4$ is 4767-03-7, CAS No. of succinic acid $C_4H_6O_4$ is 110-15-6, and CAS No. of citric acid $C_6H_8O_7$ is 77-92-9.

The thickener of the soldering flux 5 is added in such a manner that the mixture of the solvent, organic acid and amine has a predetermined viscosity. It is noted that, when the mixture of the solvent, organic acid and amine has the predetermined viscosity, the soldering flux 5 is not required to contain the thickener and the thickener can be also omitted.

The surface activating agent of the soldering flux 5 is added in such a manner that the solvent, organic acid and amine are sufficiently mixed, but addition of the surface active agent can be also omitted.

Figure 10:
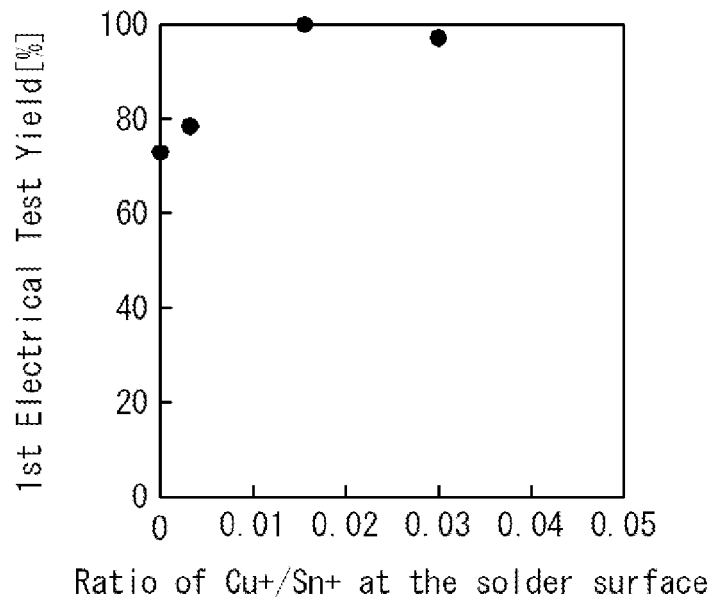
FIG. 10 is a graph showing a relation between a ratio of the number of Cu atoms to the number of Sn atoms present in the solder bump surface and a good product rate of the semiconductor device.

Next, the effects of the present invention will be described with reference to FIGS. 10 and 11. FIG. 10 shows a relation between a rate of Cu to Sn present in the surface of the solder bump 7 and a good product rate of a semiconductor device 10. A horizontal axis of FIG. 10 shows a ratio of the number of Cu atoms to the number of Sn atoms per a unit volume in the surface of the solder bump 7 measured by TOF-SIMS. A vertical axis of FIG. 10 shows a good result rate in the conducting test in items of the electric test of the solder bump 7. From FIG. 10, it could be understood that when the quantity of Cu present in the surface of the solder bump 7 increases more and more, a probability of determination of the semiconductor device 10 as a good product becomes higher. Namely, it is shown that, when the present quantity of Cu to Sn present in the surface of the solder bump 7 is increased, the conductivity of the surface layer portion 23 is improved. From FIG. 10, it could be understood that, when the ratio of the number of Cu atoms to the number of Sn atoms per a unit volume exceeds 0.01, the good product rate is remarkably improved. Moreover, it could be understood that, when the ratio of the number of the atoms is equal to or higher than 0.015, the good product rate becomes almost 100%.

In the present invention, since the ratio of the number of Cu atoms to the number of Sn atoms per a unit volume in the surface layer portion 23 of the solder bump 7 is determined to be equal to or more than 0.01 or preferably 0.015, the conductivity of the surface layer portion 23 can be improved, and a contacting resistance between the solder bump 7 and the contact pin 11 can be reduced. Therefore, it is possible to remarkably suppress a possibility of being erroneously determined to be defective due to an electrical contacting failure between the contact pin 11 and the solder bump 7 in the conducting test.

It should be noted that although FIG. 10 shows a case of using Cu as the conductive metal, similar tendencies could be obtained in a case of using Ni, Au or Ag. That is, when the ratio of the number of Ni, Au or Ag atoms to the number of Sn atoms per a unit volume exceeds 0.01, the good product rate is remarkably improved, and when the ratio of the number of atoms is 0.015 or more, the good product rate becomes almost 100%.

Figure 11:
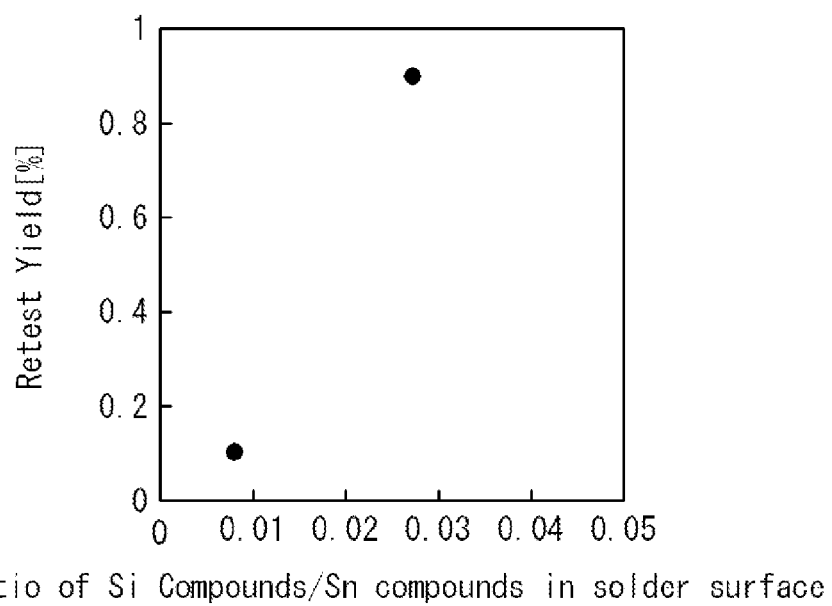
FIG. 11 is a graph showing a relation between a ratio of the number of Si atoms to the number of Sn atoms present in the solder bump surface and a good product rate obtained by a re-test of the semiconductor device.

FIG. 11 is a graph showing a relation between a ratio of the number of Si atoms to the number of Sn atoms present in the surface of the solder bump 7 and the good product rate of the semiconductor device 10.

A horizontal axis in FIG. 11 shows a ratio of the number of Si atoms to the number of Sn atoms per a unit volume in the surface of the solder bump 7 measured by TOF-SIMS. A vertical axis of FIG. 11 shows a retest yield, i.e., a good product rate in performing the conducting test of the semiconductor device 10 once more after it was once determined to be defective. Namely, it shows that, when the value of the vertical axis is higher, the ratio of a product determined to be defective in a first conducting test in spite of the product that is non-defective originally. From FIG. 11, it could be understood that, when the ratio of the number of Si atoms to the number of Sn atoms per a unit volume is smaller, the erroneous determination can be reduced. In particular, when the ratio of the number of Si atoms to the number of Sn atoms per a unit volume is smaller than 0.01, erroneous determination results are remarkably reduced. The same tendency was obtained in case of using C instead of Si. As a material containing Si or C in the surface of the solder bump 7, an insulating material derived from the solder resist 3, e.g., organic compounds such as organic silicon, acryl, epoxy, poly-dimethyl siloxane can be exemplified.

In the present invention, since the solvent of the soldering flux 5 is capable of dissolving and removing the insulating material derived from the solder resist layer 3, it is possible to suppress erroneous determination results due to material containing Si or C.

Moreover, in the present invention, since the ratio of the number of Si or C atoms to the number of Sn atoms per a unit volume in the surface layer portion 23 of the solder bump 7 is made lower than 0.01, the erroneous determination results can be remarkably suppressed.

It is noted that, although Sn is used as the main content of the base material of the solder bump 7 in the above explanation, metal materials other than Sn can be also used. Further, the base material of the solder bump 7 may include Sn and the other metals than Sn.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device comprising:
an interconnection substrate on which a semiconductor chip is mounted;
electrodes formed on a surface of said interconnection substrate; and
solder bumps formed on said electrodes,
wherein said solder bump comprises a base section and a surface layer section that covers said base section, and
wherein said surface layer section comprises conductive metal selected from the group consisting of Cu, Ni, Au, and Ag, and Sn at least and a ratio of the number of atoms of said conductive metal to the number of Sn atoms per a unit volume is more than 0.01.

2. The semiconductor device according to claim 1, wherein said ratio is equal to or more than 0.015.

3. The semiconductor device according to claim 1, wherein a thickness of said surface layer section is equal to or smaller than 6 nm.

4. The semiconductor device according to claim 1, wherein said surface layer section further comprises Si or C and a ratio of the number of the atoms of Si or C to the number of Sn atoms per a unit volume is smaller than 0.01.

5. The semiconductor device according to claim 1, wherein the ratio of the number of the atoms of said conductive metal is measured by a TOF-SIMS method.

6. The semiconductor device according to claim 4, wherein the ratio of the number of Si or C atoms is measured by the TOF-SIMS method.

7. The semiconductor device according to claim 1, wherein said solder bumps are formed on the surface of said interconnection substrate which is opposite to a surface thereof on which said semiconductor chip is mounted.

8. The semiconductor device according to claim 1, wherein said solder bumps are external connection terminals.

9. The semiconductor device according to claim 1, wherein a part of said conductive metal is coordinated with amine.

10. The semiconductor device according to claim 1, wherein said base section contains Sn.

* * * * *